United States Patent
Potter

[11] Patent Number: 6,028,437
[45] Date of Patent: Feb. 22, 2000

[54] PROBE HEAD ASSEMBLY

[75] Inventor: Curtis Nathan Potter, Austin, Tex.

[73] Assignee: SI Diamond Technology, Inc., Austin, Tex.

[21] Appl. No.: 08/858,107

[22] Filed: May 19, 1997

[51] Int. Cl.[7] .................................................. G01R 1/073
[52] U.S. Cl. .......................................... 324/757; 324/754
[58] Field of Search .................................. 324/754, 755, 324/757, 760; 439/66, 70

[56] References Cited

U.S. PATENT DOCUMENTS

| | | | |
|---|---|---|---|
| 3,832,632 | 8/1974 | Ardezzone | 324/756 |
| 5,087,878 | 2/1992 | Belmore, III et al. | 324/754 |
| 5,103,557 | 4/1992 | Leedy | 324/754 |
| 5,237,130 | 8/1993 | Kulesza et al. | 29/830 |
| 5,475,317 | 12/1995 | Smith | 324/754 |
| 5,489,854 | 2/1996 | Buck et al. | 324/755 |
| 5,633,596 | 5/1997 | Ilani | 324/754 |
| 5,772,451 | 6/1998 | Dozier, II et al. | 439/66 |
| 5,806,181 | 9/1998 | Khandros et al. | 439/66 |
| 5,808,474 | 9/1998 | Hively et al. | 324/755 |

*Primary Examiner*—Ernest Karlsen
*Attorney, Agent, or Firm*—Kelly K. Kordzik; Winstead Sechrest & Minick P.C.

[57] ABSTRACT

An apparatus for testing semiconductor devices including probe tips for contacting input/output pads on the device attached to a probe membrane fixed to a package using a layer of elastomeric material. The elastomeric material and use of compliant bump probe tips effect a global planarization for improved electrical contact between the probe assembly and the input/output contacts on the device under test.

11 Claims, 4 Drawing Sheets

PROBE HEAD ASSEMBLY

CROSS-REFERENCE TO RELATED APPLICATION

This application for patent is related to co-pending U.S. patent application Ser. No. 08/748,843, now U.S. Pat. No. 5,898,783, which is hereby incorporated by reference herein.

TECHNICAL FIELD

The present invention relates in general to the testing of semiconductor devices, and in particular to a probe assembly for testing such devices.

BACKGROUND INFORMATION

In the course of fabricating semiconductor devices, it is necessary to perform test and bum in operations on the device. In order to carry out these operations, the device temporarily must be held in a test jig of some form in order to establish electrical contact between the input and output (input/output) pads on the device under test ("DUT") and the test instrumentation. At the die level, this has previously been accomplished in the art by one of two means. One technique, "soft" Tape Automatic Bonding ("TAB") requires making a temporary bond to the DUT input/output pads. This can give rise to considerable damage to the pads after removal. The second method for holding the DUT in a test assembly is to use a carrier in the form of a multichip module ("MCM") with probe tips formed from hard metal bumps. The probe tips on the MCM are arranged in a pattern to exactly match the positions of the input/output pads on the DUT. The DUT is aligned with the probe tips by means of either a mechanical "alignment fence" or an optical technique. Because the probe tips are not sufficiently planarizing over the surface of the die, large forces are required in order to ensure good electrical contact with every input/output pad on the die. The hard metal probe tips may damage the pads. Furthermore, both of these techniques sometimes require that the DUT be mounted in a package using a temporary adhesive that can be complicated to remove. As a result, there is a need in the art for an improved test head assembly for the testing of semiconductor devices.

SUMMARY OF THE INVENTION

The foregoing need is satisfied by the present invention which includes a package having electrical contacts adaptable for connecting to device test instrumentation that also holds the DUT, and contains a compliant probe assembly referred to as the probe membrane. The package and probe membrane include features to effect global planarization of the interface between the DUT and the assembly of probe tips. The features that effect the necessary global planarization include one or more compliant bump probe tips, a compliant bonding material to mount the probe assembly in the package, and a compliant bonding layer for attaching the DUT to the package.

An advantage of the present invention is that a sufficient electrical connection between the compliant bump probe tips is made by the use of pressure applied to the outside of the package although, because of lack of global planarization, there may not be such sufficient connection at the location of one or more of the interfaces between the probe tip and the input/output pad at initial contact. Because compliant bump probe tips respond compliantly over a larger range of displacements than do metals, the pressure needed to effect global planarization is lower than with solid metal probe tips, thereby avoiding damage to the DUT.

Overdeformation of the compliant bump probe tips is prevented by another advantage of the present invention. One or more standoff structures are incorporated on the probe membrane. These have less height than the probe tips and have noncompliant properties. If excessive pressure is applied, the standoffs control the amount of deformation of the compliant bump probe tips, avoiding damage to both the compliant bump probe tips and the DUT.

An additional advantage of the present invention is the additional global planarization that is provided by the elastomeric bonding layer used to affix the probe membrane in the package. Because of the compressibility properties of the elastomeric material, deformations needed to adjust for nonplanarity and thereby effect global planarization are less than would be needed to achieve planarization in a "carrier" technique.

Another advantage of the present invention is further global planarization effected by the use of a layer of elastomeric material backing between the DUT and the package to attach it thereto. This elastomeric backing layer performs its global planarization function in the same way as the elastomeric bonding layer that affixes the probe membrane in the package.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

For a more complete understanding of the present invention, and the advantages thereof, reference is now made to the following descriptions taken in conjunction with the accompanying drawings, in which.

DETAILED DESCRIPTION

Figure 1:
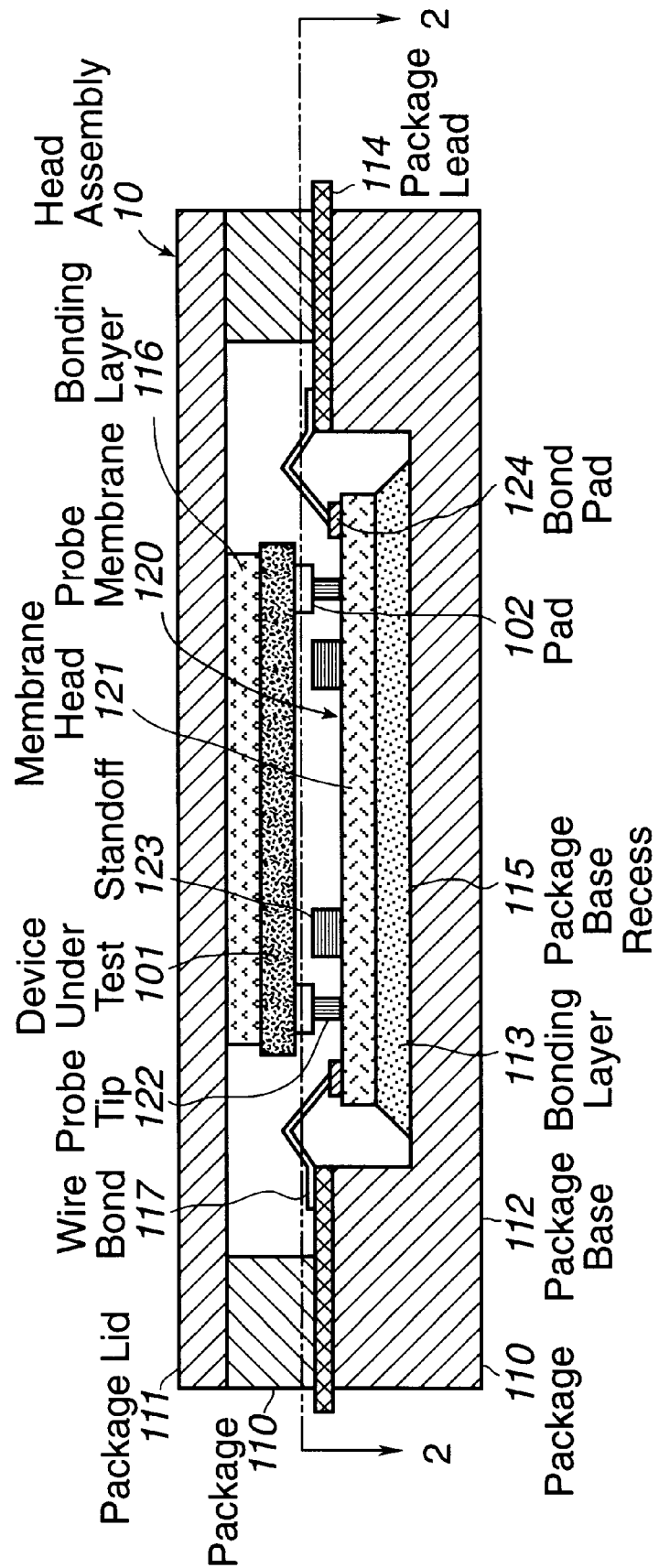
FIG. 1 illustrates a probe head assembly for testing and burn in of a semiconductor device in accordance with the present invention.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

An invention which alleviates the problems associated with the present technology used in the testing and burn in of semiconductor dies will now be described in detail. Referring to FIG. 1, there is shown a probe head assembly 10, in an elevation cross-sectional view, not to scale, in accordance with the present invention.

A device under test ("DUT") 101, which may be a die, is enclosed in the head assembly 10, which is formed from a package 110 and probe membrane 120. The package 110 is further formed from a package lid 111 and a package base 112. The DUT 101 is mounted on the package lid 111 by a layer of bonding material 113, which may be an elastomeric material. In one embodiment, the elastomeric material 113 offers some additional global planarization properties due to its compressibility properties. The package 110 may be a standard semiconductor package or any custom manufactured package.

The package 110 contains a probe membrane 120 consisting of a probe membrane head 121 on which are affixed probe tips 122. The probe membrane 120 is larger than the DUT 101 so as not to interfere with electrical connections between the probe membrane 120 and the package 110. In one embodiment, the membrane head 121 is fabricated of silicon in order to achieve an adequate thermal coefficient of expansion match between the DUT 101 and the probe membrane 120 over the range of operating temperatures of the invention. The probe tips 122 effect the electrical contact between the DUT 101 and the probe head assembly 10 by engaging pads 102 on the DUT 101. In one embodiment, probe tips 122 are compliant bump probe tips, a probe tip with a refractory thin metal shell covering a polymer bump, which has compliancy properties that will allow multiple compressive cycles within the elastic limit of the material. Compliant bump technology is discussed in U.S. Pat. No. 5,508,228 which is incorporated herein by reference.

Figure 2:
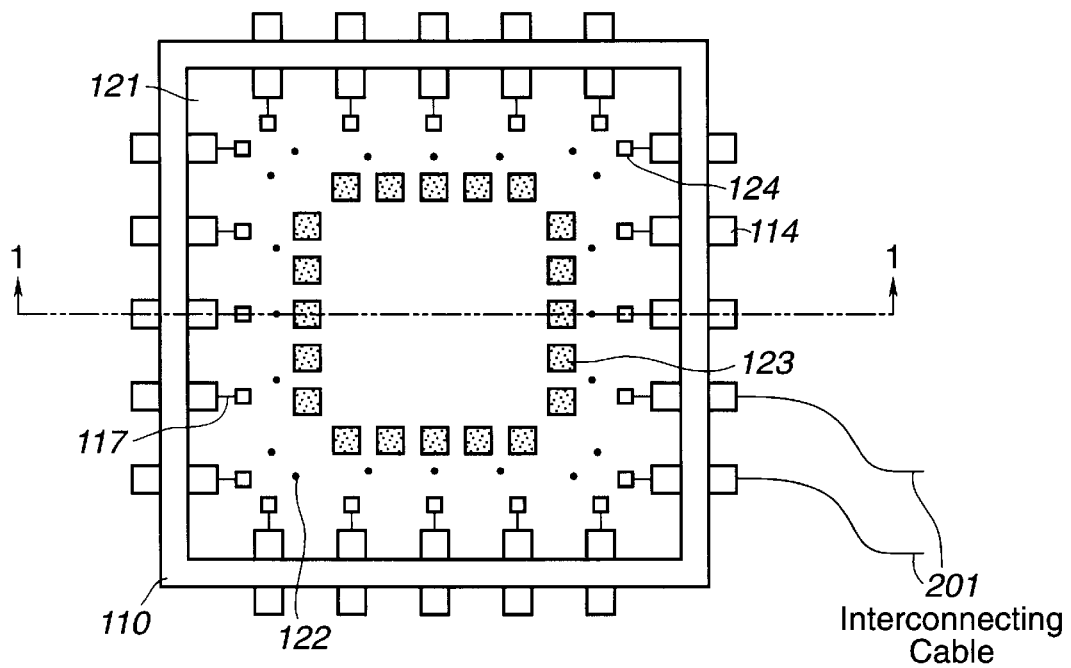
FIG. 2 illustrates a top view cross-section of a probe head assembly in accordance with the present invention.
Figure 3:
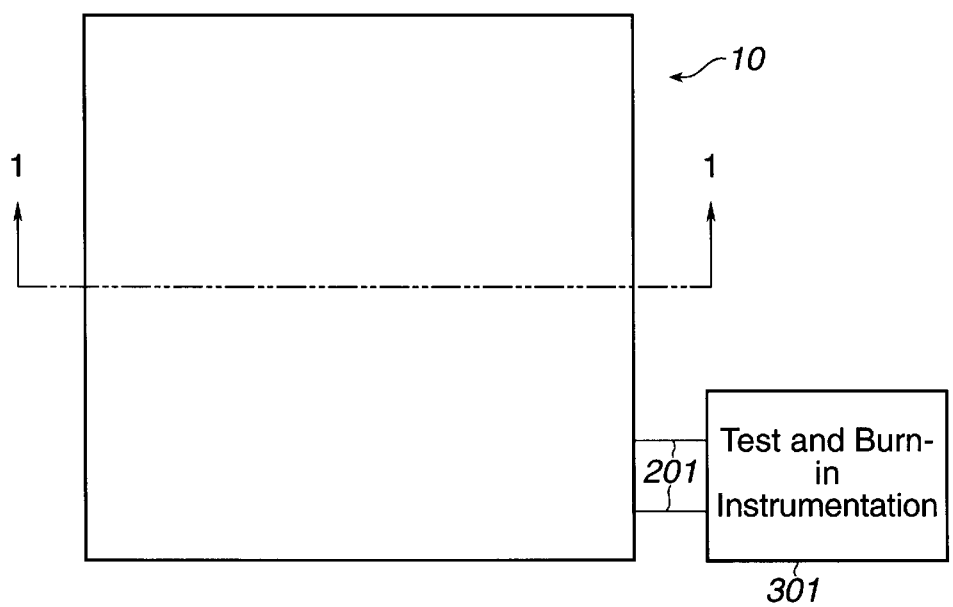
FIG. 3 illustrates an apparatus for testing and burn in of a semiconductor device.

The array of probe tips 122 on the probe membrane head 121 is illustrated in the top view cross-section of FIG. 2. The probe tips 122 are disposed on the probe membrane head 121 in an arrangement that mirrors the arrangement of input/output pads 102 (not shown) on the DUT 101 (not shown). Bond pads 124 corresponding to each of the probe tips 122 are disposed on the probe membrane head 121; electrical connection between a probe tip 122 and its corresponding bond pad 124 is effected by a conducting trace (not shown). The traces and bond pads 124 may be fabricated of aluminum. Bond pads 124 are electrically connected to corresponding package leads 114 by wire bonds 117. Such wire bonding techniques are well known in the art. The package leads 114 provide the electrical connection, via interconnecting cable 201, to the instrumentation 301 (see FIG. 3) for performing the test and burn in of the DUT 101. Such instrumentation 301 also is well known in the art.

Compliant bump probe tips 122 permit a pressing force to be performed with little or no stressing of the DUT 101, since the compliant bump probe tips 122 already in contact with pads 102 may be compressed slightly so that the other compliant bump probe tips 122 are able to eventually make contact with pads 102. Thus, the bumps are compressed within the elastic limit of the material.

Also, fabricated on the probe membrane head 121 are standoffs 123 which serve to act as a controlled collapse stops when the head assembly 10 is in operation. These ensure that, in operation, the compliant bump probe tips 122 are not driven beyond their elastic limit. The standoffs 123 may be fabricated from metal or of a polymer material; the same polymer material from which the compliant bump probe tips 122 are formed is suitable. If the same polymer material is used, the standoffs 123 should each be larger in area than the compliant bump probe tips 122 so as to have limited compressibility compared to the compliant bump probe tips 122. Forming the standoffs 123 from the same polymer material as the compliant bump probe tips has the advantage of probe membrane 120 fabrication simplicity.

Figure 4:
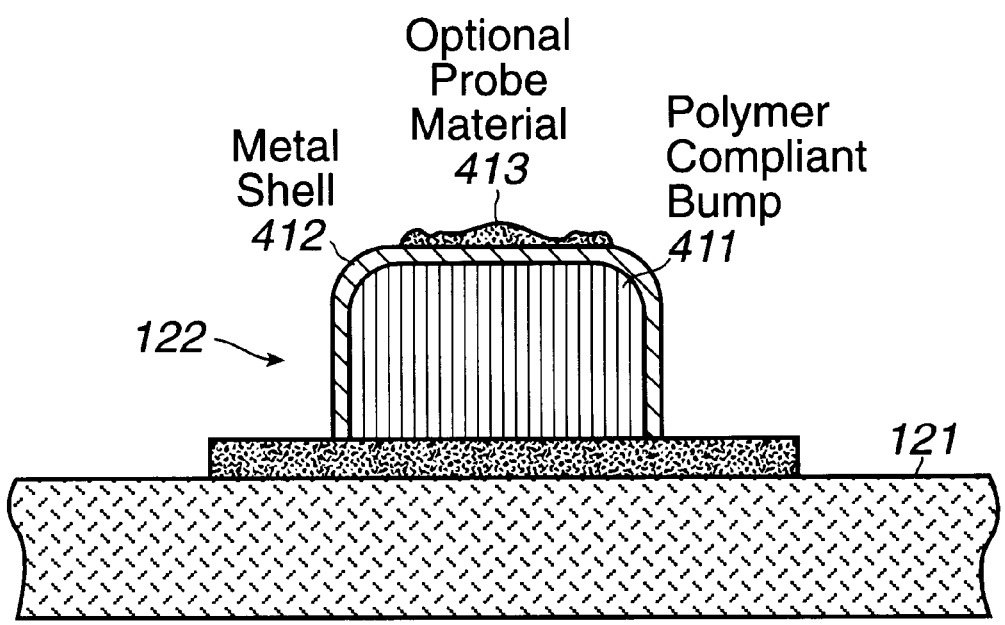
FIG. 4 illustrates a detail of a compliant bump probe tip.

Referring next to FIG. 4, an embodiment using compliant bump probe tips 122, the thin metal shell 412 on the compliant bump 411 of the compliant bump probe tip 122 establishes the electrical connection between the compliant bump probe tip 122 and the electrically conducting traces. Also, the structure of the compliant bump probe tips 122 may be shaped to effect a "scrubbing" action as pressure is applied to make the probe membrane 120 to DUT 101 contact. This can effect an improved electrical contact between the DUT 101 and probe membrane 120 by "scrubbing" through the oxide coat that usually forms on the pads 102 on the DUT 101. An optional layer of probe material 413 performs the scrubbing action. In a second embodiment, abrasive particles may be embedded, as just such a probe material, in the surface of the compliant bump probe tips 122 in order to effect better penetration of the oxide coat that typically forms on the DUT 101 pads 102.

The probe membrane 120 is mounted in a recessed portion 115 of the package base 112 and fixed to the recessed portion 115 by a bonding material 116. The height of the probe membrane 120 in the package 110 is controlled by the thickness of the bonding material 116. The bonding material 116 may be an elastomeric material. This also serves to effect some global planarization of the DUT 101 when the probe head assembly 10 is in operation.

In operation, the package lid 111 with the DUT 101 affixed to it as illustrated in FIG. 1, is brought in contact with the probe membrane 120. Alignment of the DUT 101 to the membrane 120 is accomplished using either optical alignment or mechanical alignment fence techniques; such techniques are known to one of ordinary skill in the art. In an embodiment using compliant bump probe tips 122, the DUT 101 is brought in contact with the probe membrane 120 with sufficient pressure to compress the compliant bump probe tips 122, and/or the elastomeric bonding materials 113, 116, but not so much pressure as to compress the standoffs 123. The package lid 111 is then held in place against the package base 112 by solder, mechanical clamp, or similar means (not shown), all of which are well understood by one of ordinary skill in the art. Test and burn in is then performed, followed by removal of the package lid 111, and removal of the DUT 101 from the bonding layer 113. The probe head assembly 10 is then ready for another test cycle.

Figure 5:
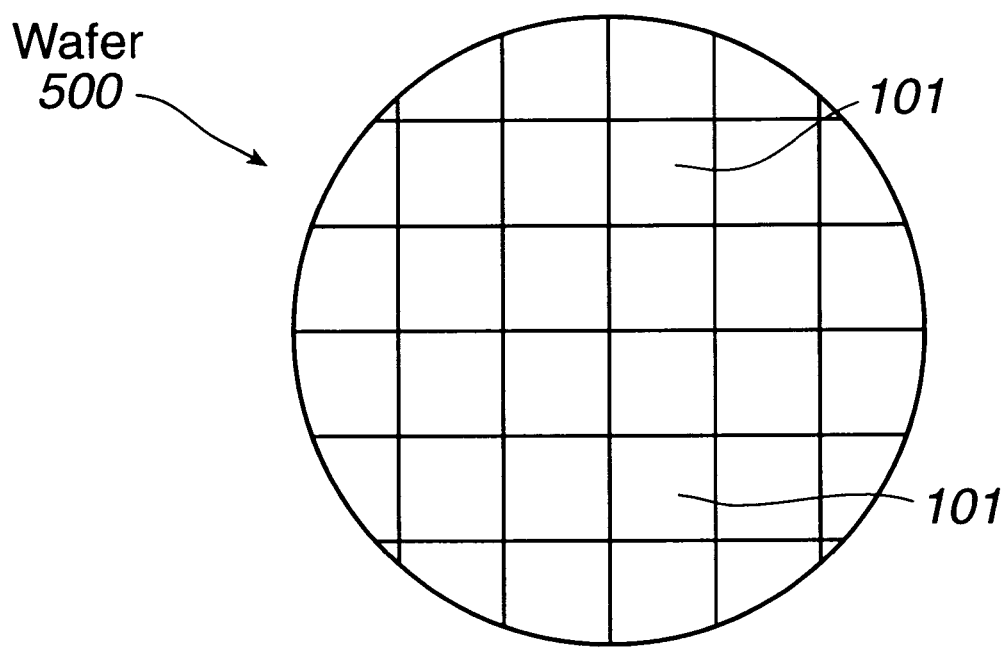
FIG. 5 illustrates a plurality of semiconductor dies comprising a semiconductor wafer.

Referring to FIG. 5, this same technique is extensible to an embodiment of a test head assembly 10 capable of testing a plurality of dies constituting each of the DUT 101 before the dies are cut from a wafer 500. In such an embodiment, the probe membrane 120 has probe tips 122 affixed to the probe membrane head 121 in an array corresponding to the input/output pads 102 for each of the DUT 101, here the dies comprising the wafer 500.

In another embodiment, the package may have a hinged package lid 111 (not shown) that automatically aligns the DUT 101 to the probe membrane 120.

Although the present invention and its advantages have been described in detail, it should be understood that various changes, substitutions and alterations can be made herein without departing from the spirit and scope of the invention as defined by the appended claims.

What is claimed is:

1. An apparatus adaptable for the testing of semiconductor devices comprising:
    a package; and
    a probe membrane contained within said package having electrical paths adaptable for coupling to test circuitry, wherein said probe membrane includes a probe membrane head, a plurality of standoffs affixed to said probe membrane, and a plurality of probe tips affixed to said probe membrane head, said probe tips adaptable for making electrical contact with pads on said semiconductor device, wherein said probe tips are compliant bump probe tips.

2. The apparatus as recited in claim 1, said package further comprising:
    a package base having an upper surface adapted to receive said probe membrane, said probe membrane head having a lower surface,
    a bonding layer interposed between said probe membrane head lower surface and said package base upper surface; and
    a package lid having a lower surface adapted to receive said semiconductor device, wherein said package lid is positioned above said package base.

3. The apparatus as recited in claim 2, wherein said bonding layer is comprised of an elastomeric material.

4. The apparatus as recited in claim 2, wherein said semiconductor device is a die having an upper surface, said upper surface fixed to said package lid lower surface by a bonding layer interposed therebetween.

5. The apparatus as recited in claim 2, wherein said semiconductor device is a wafer having an upper surface, said upper surface fixed to said package lid lower surface by a bonding layer interposed therebetween.

6. The apparatus as recited in claim 4, wherein said bonding layer interposed between said die and said package lid lower surface is comprised of an elastomeric material.

7. The apparatus as recited in claim 5, wherein said bonding layer interposed between said wafer and said package lid lower surface is comprised of an elastomeric material.

8. The apparatus as recited in claim 1, wherein the compliant bump probe tips are comprised of a solid material.

9. The apparatus as recited in claim 1, wherein the semiconductor device is a wafer containing a plurality of dies, and wherein the probe membrane head has a sufficient number of the plurality of probe tips to simultaneously test each of the dies on the wafer.

10. An apparatus adaptable for the testing of semiconductor devices comprising:
    a package, wherein said package has a package lid having a lower surface adapted for receiving said semiconductor device, said semiconductor device having an upper surface, and a package base having an upper surface;
    a probe membrane contained within said package, wherein said probe membrane has electrical paths adaptable for coupling to test circuitry, said probe membrane including a probe membrane head, said probe membrane head having a plurality of probe tips affixed thereto, a plurality of standoffs affixed thereto, and a lower surface, wherein said probe tips are adaptable for making electrical contact with pads on said semiconductor device and are compliant bump probe tips;
    a bonding layer comprising an elastomeric material interposed between said package lid lower surface and said semiconductor device upper surface; and
    a bonding layer comprising an elastomeric material interposed between said probe membrane head lower surface and said package base upper surface, said package base being adapted for receiving said probe membrane head.

11. The apparatus as recited in claim 10, wherein the compliant bump probe tips are comprised of a solid material.

* * * * *